United States Patent [19]

Folmsbee

[11] Patent Number: 4,519,050
[45] Date of Patent: May 21, 1985

[54] RADIATION SHIELD FOR AN INTEGRATED CIRCUIT MEMORY WITH REDUNDANT ELEMENTS

[75] Inventor: Alan C. Folmsbee, Santa Clara, Calif.

[73] Assignee: Intel Corporation, Santa Clara, Calif.

[21] Appl. No.: 389,415

[22] Filed: Jun. 17, 1982

[51] Int. Cl.³ .............................................. G11C 11/34
[52] U.S. Cl. ...................................... 365/53; 365/200; 365/218; 357/84
[58] Field of Search .................... 365/53, 52, 200, 218, 365/185, 183, 184; 357/84, 23 VT

[56] References Cited

U.S. PATENT DOCUMENTS

| | | | |
|---|---|---|---|
| 4,047,163 | 9/1977 | Choate et al. | 365/200 |
| 4,393,474 | 7/1983 | McElroy | 365/200 |
| 4,393,479 | 7/1983 | Du et al. | 365/218 |
| 4,423,548 | 1/1984 | Hulseweh | 357/84 |

FOREIGN PATENT DOCUMENTS

| | | | |
|---|---|---|---|
| 8002891 | 12/1980 | European Pat. Off. | 357/84 |
| 387 | 1/1979 | Japan | 357/84 |
| 98846 | 7/1980 | Japan. | |
| 20454 | 2/1982 | Japan | 357/84 |

OTHER PUBLICATIONS

McKenny, "Good Bits Swapped for Bad in 64-Kilobit EPROM," Electronics, Mar. 13, 1980, pp. 115–121.

Primary Examiner—Stuart N. Hecker
Assistant Examiner—Glenn A. Gossage
Attorney, Agent, or Firm—Blakely Sokoloff, Taylor & Zafman

[57] ABSTRACT

A shield for an EPROM cell comprising an upper cover and upstanding elements. Generally MOS electrically programmable read-only memories (EPROMs), can be erased by exposure to radiation. Typically, the EPROM is encapsulated in a package which has a transparent lid to allow radiation to pass through the package to erase the EPROM cells. The invented shield protects selected EPROM cells from the radiation and thus prevent these cells from being erased even though the entire EPROM package is subjected to radiation and other EPROM cells are erased. The shielded EPROM cells are useful for discretionary connections such as those needed in redundant memories.

6 Claims, 5 Drawing Figures

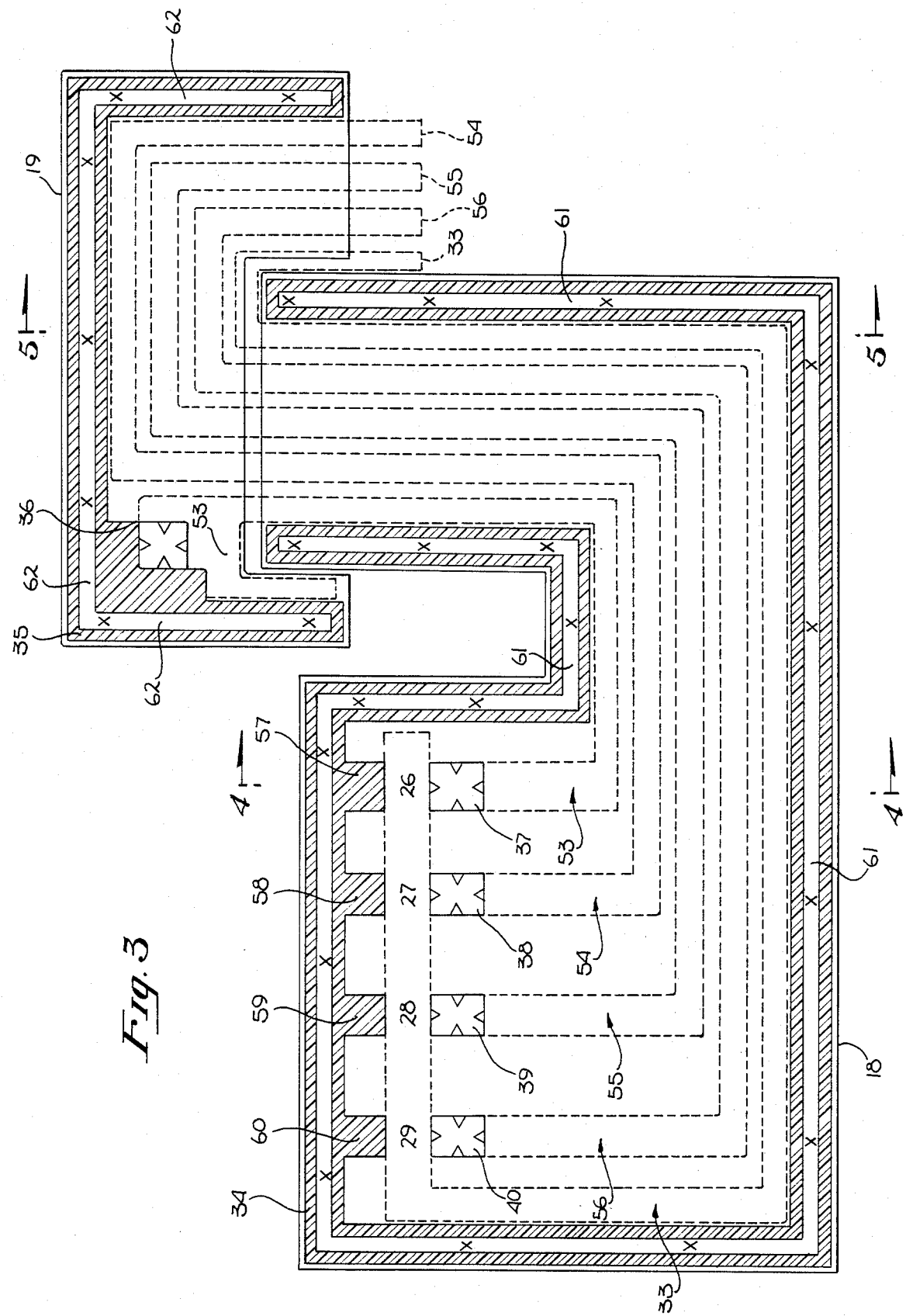

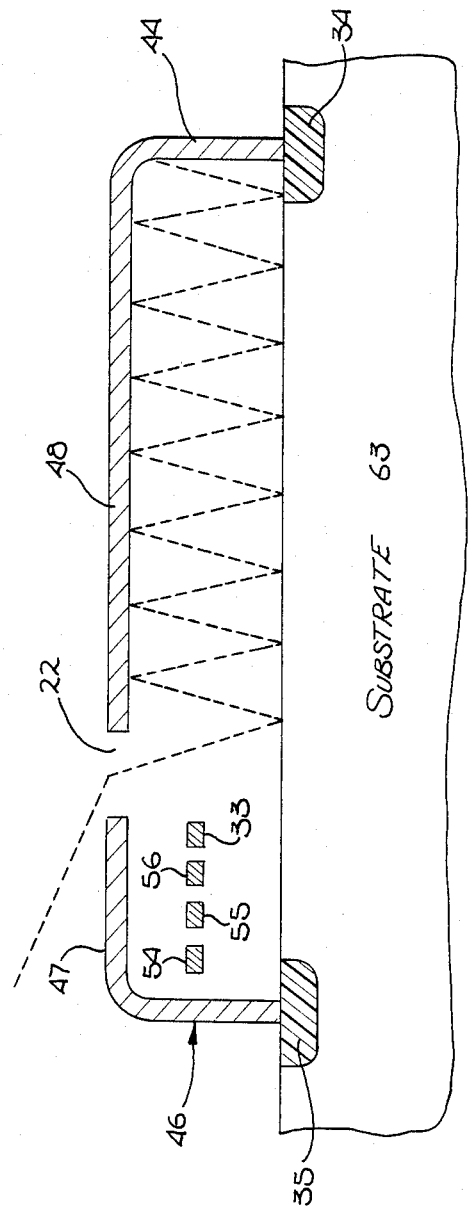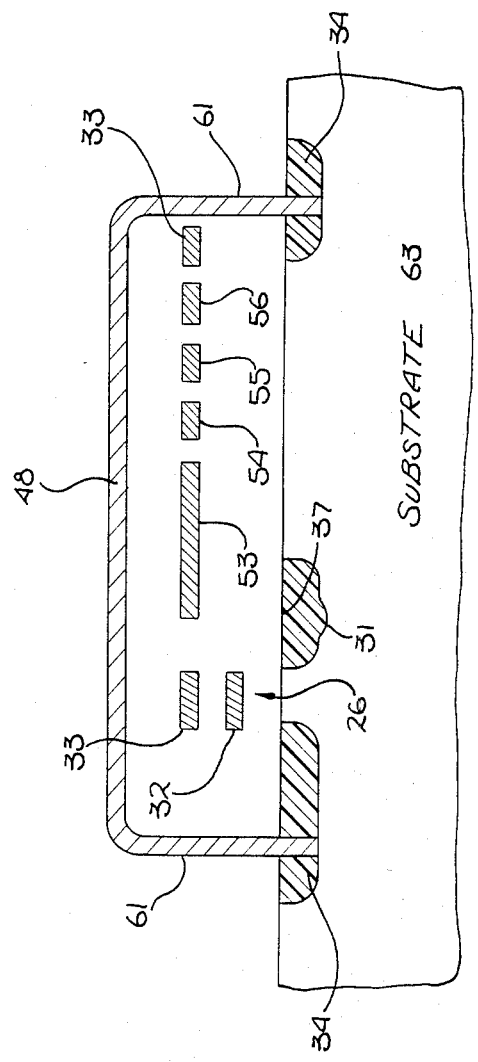

RADIATION SHIELD FOR AN INTEGRATED CIRCUIT MEMORY WITH REDUNDANT ELEMENTS

BACKGROUND OF THE INVENTION

1. Field of the Invention

This invention relates to the field of MOS electrically programmable read-only storage devices which are capable of being erased by exposure to radiation.

2. Prior Art

Metal-oxide-semiconductors (MOS) electrically programmable read-only memories (EPROMs) have been utilized for the storage of information in the prior art. A cell for such memories is described in U.S. Pat. No. 3,996,657. These memories are erased by exposure to ultraviolet radiation. Memory arrays which employ such cells are disclosed in U.S. Pat. Nos. 3,728,695 and 3,744,036.

Redundant rows and columns have been utilized in the prior art for replacing defective rows and columns in read-only memories (ROMs) and random-access memories (RAMs). Fusible silicon links are used to enable these redundant elements. (A process for making a PROM employing fusible silicon links is described in U.S. Pat. No. 3,792,319.) U.S. Pat. No. 4,250,570 describes a memory employing redundant elements. Another redundancy system for memories is shown in Memory Redundancy Apparatus for Single Chip Memories, Ser. No. 320,600 filed Nov. 21, 1981 and assigned to the assignee of the present invention.

It is an object of this invention to provide a shield for integrated circuits with areas sensitive to radiation, some of which areas must be protected from radiation.

It is another object of this invention to provide an improved redundant memory circuit by shielding selected EPROM cells from radiation.

SUMMARY OF THE INVENTION

A shielding structure is provided for protecting certain radiation sensitive areas of an integrated circuit from radiation while permitting radiation to strike other radiation sensitive areas. Such shielded areas are particularly useful in a programming means for repairing defective EPROM arrays where the array is typically erased by exposure to ultraviolet radiation. The invention is also useful to provide limited customizing of EPROM products. For example, a shielded EPROM cell may be used to enable or disable certain features or may be used to program the logic level required for a particular function. In the preferred embodiment, a plurality of EPROM cells are enclosed within a shielding structure comprised of a metal shield and associated cap such that radiation entering the shielding structure is minimized and in any event must traverse a circuitous path before reaching the shielded EPROM cells.

The novel features which are believed to be characteristic of the invention, is the use of shielded EPROM cells in conjunction with a programming means to permanently modify the functionality of an EPROM. The structure of the shield, together with further objects and advantages thereof, will be better understood from the following description in connection with the accompanying drawings in which the presently preferred embodiment of the invention is illustrated by way of example. It is to be expressly understood, however, that the drawings are for purposes of illustration and description only and are not intended as a definition of the limits of the invention.

BRIEF DESCRIPTION OF THE DRAWINGS

FIG. 3 is a topological layout of the presently preferred embodiment of the invention which uses a minimum of silicon substrate area.

FIG. 4 is a cross-sectional elevation view of the invention taken through section line 4—4 of FIG. 3.

FIG. 5 is a cross-sectional elevation view of the invention taken through section line 5—5 of FIG. 3. This view demonstrates the path radiation will take after entering the shielding structure at an opening.

DETAILED DESCRIPTION OF THE INVENTION

A shield is described which is useful for protecting EPROM cells from radiation so that electrically programmable read-only memory cells which cannot be erased when exposed to radiation may be fabricated on the same substrate as electrically programmable read-only memory (EPROM) cells which can be erased when exposed to radiation. The term EPROM as used in this application refers to a memory which can be electrically programmed and erased repeatedly by exposure to radiation. Erasure typically occurs when the EPROM is exposed to specific doses of radiation. The invention permits selected EPROM cells to be effectively converted to programmable read-only memory (PROM) cells by shielding these selected cells from radiation. A typical use of these shielded EPROM cells in an EPROM is in a programming means which disables defective elements and enables equivalent (redundant) elements in the memory.

Figure 1:
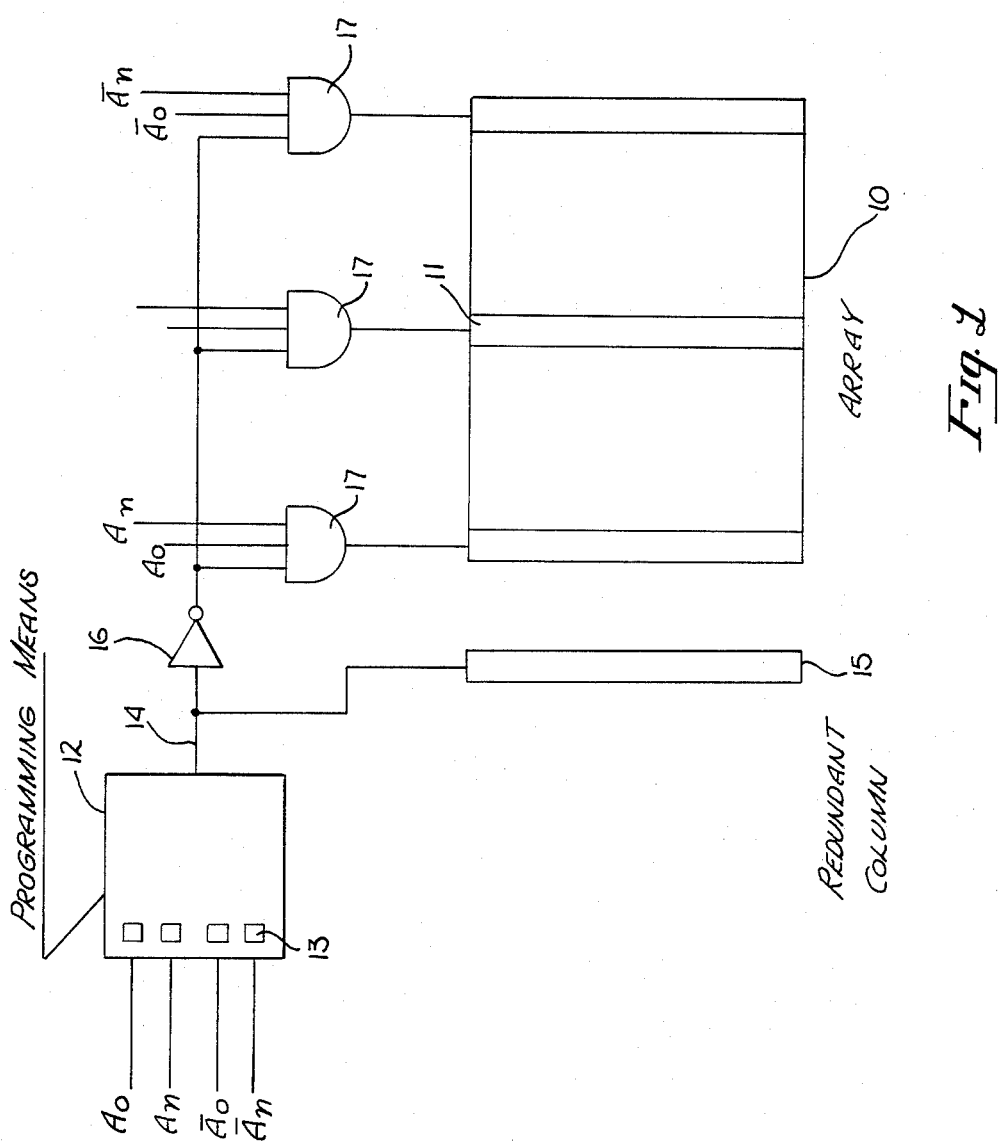
FIG. 1 is a block diagram of an EPROM which includes a redundant column and a programming means which incorporates the teachings of the present invention to select such redundant column.

FIG. 1 is a block diagram of a memory with a redundant memory circuit. An array 10 is shown with a defective column 11. A programming means 12 which includes shielded EPROM cells 13, is shown. Assume that a high state on the output 14 selects redundant column 15. The cells 13 would be programmed in such a manner that when defective row 11 is selected by the address signals, the output of the programming means 14 will be in a high state. Consequently, redundant column 15 will be selected. When the output 14 is high, the output of inverter 16 will necessarily be low. The output of inverter 16 is connected to the input of all of the AND gats 17 which are used to decode the column address. Since the output of inverter 16 is connected to the input of each AND gate 17, the output of each AND gate 17 must necessarily be low when the output of inverter 16 is low. Hence, when defective column 11 is addressed, column 11 is disabled and the redundant column 15 is selected instead. The cells which make up array 10 are EPROM cells which are erased when exposed to radiation. The cells 13 in the programming means may be the same EPROM cell but such cells would be protected from radiation by the present invention. Thus, the cells 13 would be shielded EPROM cells and could be programmed once in such a manner that the redundant column 15 would be selected in place of the defective column 11.

The shielded EPROM cells may also be useful to customize an EPROM. For example, certain users of the EPROM may desire the EPROM to be selected in a particular system when the chip select pin of the EPROM is in the high state. Other users would prefer that the EPROM be selected when the chip select pin is in a low state. The user could select the proper logic state by programming the shielded EPROM cell. The shielded EPROM cell would also be useful in providing the user with the option of enabling or disabling a particular function. For example, suppose that two different functions were designed into an EPROM but that the number of pins available required that both functions be connected to the same pin. Assume further that one function is useful to a certain class of users and the other function is useful to a second class of users. The shielded EPROM cell would provide a means for the user to select the function of its choice. A further use of the shielded EPROM cell would be to digitally adjust reference voltages (e.g., a particular reference voltage would result depending on the number of shielded EPROM cells programmed).

The prior art (such as U.S. Pat. No. 4,250,570) taught that fusible silicon links (fuses) could be used in a programming means to select redundant elements. However, there are many problems associated with such fuses which do not exist when a shielded EPROM cell is used in the programming means in place of a fuse. The fuse is an additional circuit element which must be characterized and monitored in addition to the other circuit elements normally used in an EPROM.

Another problem with the fuses is that they are difficult to manufacture in a consistent manner. Consequently, the fuses are not reliable. Some fuses may be blown at a particular current while other fuses require a higher current to be blown. The unreliability of these fuses is a significant problem associated with the prior art fuses. Furthermore, the layout of the silicon fuse requires a significant amount of silicon substrate area when compared to the EPROM cell layout. The larger layout required for the fuse will result in a higher overall cost of the EPROM. Finally, an opening in the oxide is normally made above the fuse so that the fuse can be reliably blown and yet protected from blowing spuriously. Such an opening permits foreign material to accumulate on the fuse. This material causes reliability problems and is a significant problem associated with prior art fuses.

All of the above problems are overcome by the use of a shielded EPROM cell in place of a fuse. No extra element is required since the shielded EPROM cell is simply the standard EPROM cell used in the array which is protected from radiation by a shielding structure. The shielding structure is fabricated as part of the deposition of an opaque material such as metal (typically aluminum) in the standard EPROM process. The shielded EPROM cell will be as reliable as the EPROM cell in the array. No openings in the oxide will be necessary since the cell is simply a shielded EPROM cell which is permanently programmed by the same mechanisms used to program the cells in the array.

The basic MOS device is a sandwich of many oxides which are transparent to radiation. It has been learned that while an opaque upper cover over the cell prevents radiation from entering the cell perpendicular to the plane of the oxides, radiation still enters under the cover in the plane of the oxides. With just an upper cover there is nothing to stop the radiation from entering in the plane of the oxides from traveling to the cell area and thereby erasing the celUpstanding members extending down from the cover are needed to prevent radiation from entering in the plane of the oxides. These upstanding members would have to contact the substrate to prevent radiation from entering the gate oxide. However, a box-like shield made out of a conductor does not leave a path for other conductors connected to the cells to communicate with other circuitry of the EPROM. Consequently, the cells could not be programmed nor once programmed, could the state of the cell be sensed.

A box-like shield without an opening could be used as a shield if an opaque insulator (such as silicon nitride, paint, or photoresist) was used to form the shield. The problem with this solution is that additional processing steps would be required to form the shield. These steps would increase the cost of the process and require the performance of significant reliability studies.

As discussed earlier, EPROMs will be repeatedly programmed and erased. During the erase cycle, they will typically be exposed to ultraviolet radiation for approximately 30 minutes. The goal of the presently preferred embodiment is to prevent the floating gate from losing significant charge when exposed to radiation for 300 hours.

The invention is a shielding structure which minimizes the radiation that can travel to the floating gate of the EPROM cell and particularly minimizes the radiation that can enter the EPROM cell in the plane of the oxides. Polysilicon was used in experiments as a shielding structure for the EPROM cells. Experimental data showed that a layout of one shield made of polysilicon and one cap made of polysilicon impeded the radiation from reaching the shielded cell but the cells still lost significant charge when the EPROM was exposed to radiation. Consequently, a metal (aluminum) shield and metal cap were chosen for the presently preferred embodiment of this invention.

Figure 2:
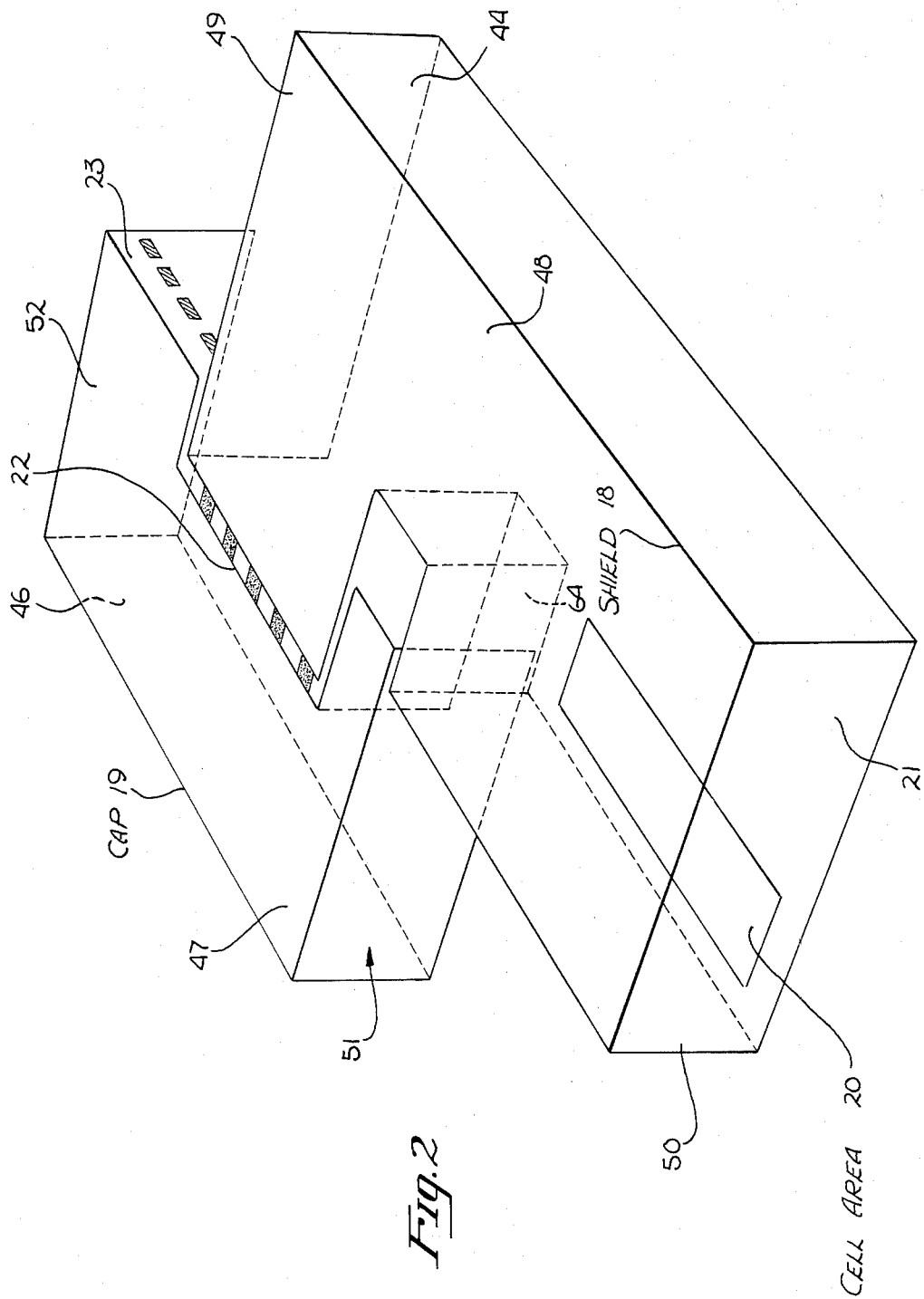
FIG. 2 is a pictorial view of the presently preferred embodiment of the invention.

FIG. 2 shows the shield 18 as a continuous structure comprised of a first upper cover 48 and an upstanding member which includes sides 21, 44, 49, and 50. The upstanding member extends down from the first upper cover to make contact with the substrate. The cap 19 is also a continuous structure comprised of a second upper cover 48 and a second upstanding member which includes sides 46, 51 and 52. The second upstanding member extends down from the second upper cover 47 to make contact with the substrate. Shield 18 and cap 19 form the shielding structure which protects the four EPROM cells 26–29 from radiation. In an actual MOS device, the shield 18 and cap 19 will not have sharp corners as shown in FIG. 2 but will be rounded during the actual fabrication process. It is important to note that the metal sides such as side 21 extend down and make contact with the substrate. This is important to insure that radiation cannot enter through the gate oxide.

Light can only enter the shield through opening 22 or opening 23. Opening 23 defined by cap 19 provides a means for conductors to leave the shielding structure so that the shielded EPROM cells can be connected to other circuitry of the EPROM. This is necessary to program the cells and to later sense the state of the cells. The presently preferred embodiment encloses four EPROM cells within a single shielding structure. The drain region of each EPROM cell, a common source region and a common select gate must be available for connection to other circuitry. To provide these six connections, but minimize the overall width of opening 23, shield 18 is connected to the diffusion which forms the sources of the cells. (The sources of the four cells are common since they are a single diffusion.) Furthermore, one of the drain regions of the four shielded cells is connected to cap 19. Consequently, while six connections are required only four polysilicon conductors pass through opening 23. Five polysilicon conductors pass under opening 22, but one is connected to cap 19. Therefore, the widths of openings 22 and 23 are minimized. However, to achieve this, there must be a space between the shield 18 (which is tied to the common source regions) and the cap 19 (which is tied to a drain region). Radiation entering narrow opening 22 is reflected by the substrate to the metal and many reflections occur before the radiation reaches the cell area 20. Such radiation is substantially attenuated and does not significantly erase the shielded EPROM cells.

FIG. 3 is a topological view of the presently preferred embodiment of the invention. The dotted lines on the topological view outline the second layer of polysilicon lines. In the presently preferred embodiment, each cell includes a floating gate fabricated from a first layer of polysilicon. Each cell 26-29 includes a drain region (underneath buried contacts 37-40) which is coupled through buried contacts 37-40 to a second layer polysilicon line 53-56 respectively.

FIG. 4 shows a cross-sectional view of cell 26 as a typical prior art floating gate EPROM cell. Cell 26 is fabricated on substrate 63 and consists of a source region 34, the drain region 31, the floating gate 32 fabricated from the first polysilicon layer, and the second polysilicon gate 33 which is the control gate. Floating gate 32 can be electrically programmed and erased when exposed to radiation. A similar structure exists for cells 27-29. The second polysilicon gates of cells 26-29 are connected together with polysilicon line 33.

Returning to FIG. 3, the sources 57-60 of cells 26-29 are connected together by the common diffusion 34. The areas 61 marked with an "X" on FIG. 3 indicate the areas in which metal extends into the substrate and into the diffusion 34. Consequently, the sources 57-50 of cells 26-29 are connected to the metal shield 18 via diffusion 34. In a similar manner, diffusion 35 extends about cap 19. Diffusion 35 is connected to metal dap 19 via area 62 which extends into the substrate and into diffusion 35. Buried contact 36 connects the diffusion 35 to a second polysilicon layer line 53 which in turn is connected to the drain region of cell 26 through buried contact 37. Consequently, the drain region of cell 26 is connected to the metal cap 19.

In order to select each of cells 26-29 separately, conductors connected to each terminal of each cell must be available to be connected to other circuitry in the EPROM. As discussed above, the drain of cell 26 is available to be connected to other circuitry in the EPROM since it is connected to cap 19. The drains of cells 27-29 are connected to polysilicon lines 54-56 through buried contacts 38-40, respectively. Polysilicon lines 53-56 and gate 33 (a total of 5 lines) cross opening 22 separately. Lines 54-56 and the gate 33 continue around cap 19 to opening 23.

Metal (typically aluminum) is deposited above the entire structure of FIG. 3 and is indicated by the unmarked and unshaded areas. The same metal flows down to the substrate in the areas 61 and 62 indicated with an "X" to form the walls of the shield 18 and cap 19.

Cap 19 caps off opening 22, i.e. it prevents radiation from entering opening 22 in the plane of the oxide. Any radiation entering opening 22 must enter at an angle almost perpendicular to the substrate. Consequently any radiation which is not absorbed by the substrate will be reflected toward the metal at a very steep angle. Radiation will then be reflected by the metal towards the substrate at a steep angle where part will be absorbed and part reflected again. Due to repeated absorptions and reflections, the radiation will be greatly attentuated by the time that it reaches the cell area 20. On the other hand, radiation can enter opening 23 in the plane of the oxide and travel to cell area 20 without significant attenuation. Consequently, it is important to minimize the total width of the opening. For this reason, the drain of cell 26 was connected via the buried contact 36 to the metal cap 19 so that although five conductors must pass through opening 22, only four conductors must pass through opening 23. Furthermore, the sources of cells 26-29 must also be available for connection to other circuitry. By connecting the sources to the metal shield 18, the source regions can easily be connected to other circuitry or grounded without the need for bringing another conductor out through opening 22 or 23.

The protective properties of the shield can be understood by review of FIG. 2. Radiation travels in a straight line and radiation will not traverse sharp bends or angles except as reflected around these angles. First, assume that cap 19 was not part of the structure. Radiation could enter the shield in the plane of the oxide through the opening 22 and pass directly to side 44 of shield 18 without significant attenuation. It is important that side 44 is parallel to opening 22 so that most radiation will be reflected off side 44 toward opening 22. Side 64 prevents radiation entering opening 22 from reaching the cell area 20 without being reflected off side 44. Side 21 should be parallel to side 49 and perpendicular to both the cell area 20 and side 44. Radiation entering opening 22 must now be reflected in such a manner that the radiation traverses two angles of approximately 90 degrees before reaching cell area 20. Radiation entering opening 22 in the plane of the oxide would be very strong when it reached side 44 and therefore significant amounts could be reflected and still reach the cell area 20. Therefore, cap 19 is placed across the opening 22 to prevent radiation from entering in the plane of the silicon dioxide.

With cap 19 in place, radiation can only enter through opening 23 in the plane of the silicon dioxide. Therefore, it was important to minimize the breadth of this opening. Radiation entering opening 23 will proceed to side 46 of cap 19. Side 46 should be parallel to opening 22 so that radiation entering opening 23 will be reflected right back out of the opening 23 by side 46. Radiation entering opening 23 would have to make an angle of approximately 90 degrees to reach opening 22. Consequently, very little radiation which has entered in the plane of the silicon dioxide will be reflected through opening 22 towards side 44 and the cell area 20. Furthermore, as discussed above, any radiation reaching side 44 would still have to be reflected so as to traverse two more angles of approximately 90 degrees before reaching cell area 20.

The most common type of radiation which is used to erase EPROMs is ultraviolet radiation. When ultraviolet radiation strikes a silicon substrate, approximately 35% of the radiation is absorbed and 65% is reflected. Metal will absorb very little radiation and consequently will reflect almost all radiation striking it. FIG. 5 shows how radiation entering opening 22 would be reflected as it travels towards metal side 44. It is known that the refractive index of air is 1 and that the refractive index of silicon dioxide is 2. According to Snell's law, radiation entering from the air into the silicon dioxide will be reflected toward the perpendicular. Light will pass directly through the silicon dioxide to the substrate where approximately 35% will be absorbed and 65% will be reflected towards the metal. The metal then will reflect almost all of the radiation back to the substrate where it will be continually absorbed and reflected.

Many variations of the preferred embodiment can be made depending on the amount of radiation which the EPROM cell can withstand. For example, in some circumstances, the cap 19 may not be necessary. In other circumstances, cap 19 could be connected to shield 18 so that opening 22 does not exist and five conductors would pass through opening 23. Additional right angles could be added to the shielding structure so that radiation would have to traverse more right angles before reaching the EPROM cell. It is also possible that in certain cases polysilicon or certain insulators may be sufficiently opaque to be used to form the shield and/or cap. A refresh circuit could be added to reinforce the data in the shielded EPROM cell. Each time the EPROM cell is programmed, the shielded EPROM cells would be sensed and the data sensed rewritten into the shielded EPROM cells. Such a refresh circuit would assist in preventing total erasure of the shielded EPROM cells even if some radiation reached the shielded EPROM cells during the erasure of the EPROM. It will be obvious to one having ordinary skill in the art that numerous other modifications and departures may be made in the layout of the shielding structure depending on the degree of protection that the shielded area requires, the number of cells to be shielded, and the substrate area which is used for the shield; thus the invention is to be construed as being limited only by the spirit and the scope of the appended claims.

I claim:

1. In a metal-oxide-semiconductor (MOS) electrically programmable read only-memory (EPROM) which is fabricated on a substrate and which is erased when exposed to radiation, an improvement comprising:
   redundant elements to be used in place of defective elements;
   a programming means for programming said redundant elements so as to cause said redundant elements to be used in place of said defective elements, said programming means including at least one EPROM cell which is erased when exposed to radiation; and
   a shielding member comprising an upper cover and upstanding members extending from said upper cover to said substrate disposed about said EPROM cell which causes radiation incident on said memory to be attenuated before striking said EPROM cell thus inhibiting said EPROM cell from being erased when said memory is exposed to radiation;
   whereby said EPROM cell can be permanently programmed so that said redundant elements are always used in place of said defective elements.

2. The memory of claim 1 wherein said shielding member is disposed over the surface of said EPROM cell and extends normally into said EPROM cell at the edges of said EPROM cell so as to make contact with said substrate.

3. The memory of claim 2 wherein said shielding member is a conductor which defines an opening above the substrate so as to allow conductors connected to said EPROM cell to pass through said opening, said opening formed such that radiation entering said opening must traverse at least one angle of approximately 90 degrees before reaching source and drain regions of said cell.

4. The memory of claim 3 wherein said shielding member is connected to a diffusion region formed in said substrate, said diffusion being common with said EPROM cell so as to reduce the number of said conductors passing through said opening.

5. The memory of claim 4 wherein said shielding member is disposed about a plurality of said EPROM cells.

6. The memory of claim 5 wherein said shielding member is comprised of metal.

* * * * *

UNITED STATES PATENT AND TRADEMARK OFFICE
CERTIFICATE OF CORRECTION

PATENT NO. : 4,519,050
DATED     : May 21, 1985
INVENTOR(S) : Folmsbee

It is certified that error appears in the above-identified patent and that said Letters Patent is hereby corrected as shown below:

| COLUMN | LINE | DESCRIPTION |
|--------|------|-------------|
| 2 | 54 | Please delete "gats" and insert --gates--. |
| 4 | 2 | Please delete "CelUpstanding" and insert --cell. Upstanding--. |
| 5 | 47 | Please delete "dap" and insert --cap--. |

Signed and Sealed this

Third Day of February, 1987

Attest:

DONALD J. QUIGG

*Attesting Officer*    *Commissioner of Patents and Trademarks*